United States Patent
Schricker et al.

(10) Patent No.: US 10,734,543 B2
(45) Date of Patent: Aug. 4, 2020

(54) METHOD FOR ATTACHING CERAMIC PHOSPHOR PLATES ON LIGHT-EMITTING DEVICE (LED) DIES USING A DICING TAPE, METHOD TO FORM A DICING TAPE, AND DICING TAPE

(71) Applicant: KONINKLIJKE PHILIPS N.V., Eindhoven (NL)

(72) Inventors: April Schricker, San Jose, CA (US); Niek Van Leth, Eindhoven (NL); Daniel Roitman, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/556,237

(22) PCT Filed: Mar. 4, 2016

(86) PCT No.: PCT/US2016/020843
§ 371 (c)(1),
(2) Date: Sep. 6, 2017

(87) PCT Pub. No.: WO2016/144732
PCT Pub. Date: Sep. 15, 2016

(65) Prior Publication Data
US 2018/0053877 A1 Feb. 22, 2018

Related U.S. Application Data

(60) Provisional application No. 62/129,282, filed on Mar. 6, 2015.

(51) Int. Cl.
*H01L 33/00* (2010.01)
*C09K 11/02* (2006.01)
(Continued)

(52) U.S. Cl.
CPC .......... *H01L 33/0079* (2013.01); *C09K 11/02* (2013.01); *C09K 11/08* (2013.01);
(Continued)

(58) Field of Classification Search
CPC .................. H01L 33/50; H01L 33/505; H01L 2933/0041; H01L 21/6836
See application file for complete search history.

(56) References Cited

U.S. PATENT DOCUMENTS

| 5,561,231 A | 10/1996 | Dauth et al. |
| 7,875,533 B2 | 1/2011 | Epler et al. |

(Continued)

FOREIGN PATENT DOCUMENTS

| CN | 102373022 A | 3/2012 |
| CN | 103153611 A | 6/2013 |

(Continued)

OTHER PUBLICATIONS

Bai, "Manufacturing of Platinum- and Color-Free Organosilicon Products Using Heterogeneous Platinum Catalysts," Industrial & Engineering Chemistry Research. 53. 1588-1597 (2014).

(Continued)

*Primary Examiner* — David C Spalla

(57) ABSTRACT

A method includes mounting a ceramic phosphor (102) on an acrylic-free and metal-containing catalyst-free tacky layer (108) of a dicing tape (104), dicing the ceramic phosphor (102) from the dicing tape (104) into ceramic phosphor plates (11)2, removing the ceramic phosphor plates (112) from the dicing tape (104), and attaching the ceramic phosphor plates (112) on light-emitting device (LED) dies.

18 Claims, 3 Drawing Sheets

(51) Int. Cl.
*C09K 11/08* (2006.01)
*C09K 11/77* (2006.01)
*H01L 21/683* (2006.01)
*H01L 33/50* (2010.01)

(52) U.S. Cl.
CPC .......... *C09K 11/77* (2013.01); *H01L 21/6836* (2013.01); *H01L 33/505* (2013.01); *H01L 2221/68331* (2013.01); *H01L 2933/0041* (2013.01)

(56) References Cited

U.S. PATENT DOCUMENTS

| | | |
|---|---|---|
| 2009/0227089 A1 | 9/2009 | Plaut et al. |
| 2012/0028442 A1 | 2/2012 | Takamoto et al. |
| 2013/0062646 A1* | 3/2013 | Yen .................. H01L 33/505 257/98 |
| 2014/0091347 A1* | 4/2014 | Shirakawa ............... C09J 7/22 257/98 |
| 2020/0091381 A1 | 3/2020 | Camras et al. |

FOREIGN PATENT DOCUMENTS

| | | |
|---|---|---|
| CN | 103427004 A | 12/2013 |
| CN | 103715344 A | 4/2014 |
| EP | 2610058 | 7/2013 |
| JP | 51081650 A | 4/1986 |
| JP | 2003177241 | 6/2003 |
| JP | 2006328104 A | 12/2006 |
| JP | 2010287777 A | 12/2010 |
| JP | 2013539229 A | 10/2013 |
| TW | 201414018 A | 4/2014 |

OTHER PUBLICATIONS

Dow Corning, "Dow Corning® HM-2500/HM-2510 Assembly SealantDow—Silicone Reactive Hot Melt—An Innovative Silicone Sealant Technology," (2006).

* cited by examiner

METHOD FOR ATTACHING CERAMIC PHOSPHOR PLATES ON LIGHT-EMITTING DEVICE (LED) DIES USING A DICING TAPE, METHOD TO FORM A DICING TAPE, AND DICING TAPE

CROSS REFERENCE TO RELATED APPLICATIONS

This application is the U.S. National Stage, under 35 U.S.C. § 371, of International Application No. PCT/US2016/020843, filed Mar. 4, 2016, which claims the benefit of U.S. Provisional Application No. 62/129,282, filed Mar. 6, 2015, the contents of which are hereby incorporated by reference herein.

FIELD OF THE INVENTION

The present disclosure relates to semiconductor light-emitting diodes or devices (LEDs), and more particular ceramic phosphor plates for the LEDs.

BACKGROUND

In a flip-chip light-emitting diode or device (LED), contacts are located on the bottom of the LED and light is emitted from the top of the LED. LED epitaxial layers are grown on a patterned sapphire growth substrate, which is left attached to the epitaxial layers to increase light output. The epitaxial layers and the growth substrate are singulated into dies and directly attached to a ceramic tile substrate. Separately, a ceramic phosphor is formed and diced to form ceramic phosphor plates. For each die, a silicone-based glue is dispensed onto its sapphire and a ceramic phosphor plate is picked and placed on the sapphire. A white titanium oxide silicone composite (TiO-silicone) is dispensed on and between the dies on the ceramic tile substrate. Excess TiO-silicone is removed from the top of the ceramic phosphor plates by wet bead blasting and then the individual dies are singulated.

SUMMARY

In one or more examples of the present disclosure, a method includes mounting a ceramic phosphor on an acrylic-free tacky layer of a dicing tape, dicing the ceramic phosphor from the dicing tape into ceramic phosphor plates, removing the ceramic phosphor plates from the dicing tape, and attaching the ceramic phosphor plates on light-emitting device (LED) dies.

BRIEF DESCRIPTION OF THE DRAWINGS

In the drawings.

Use of the same reference numbers in different figures indicates similar or identical elements.

DETAILED DESCRIPTION

Figure 1:
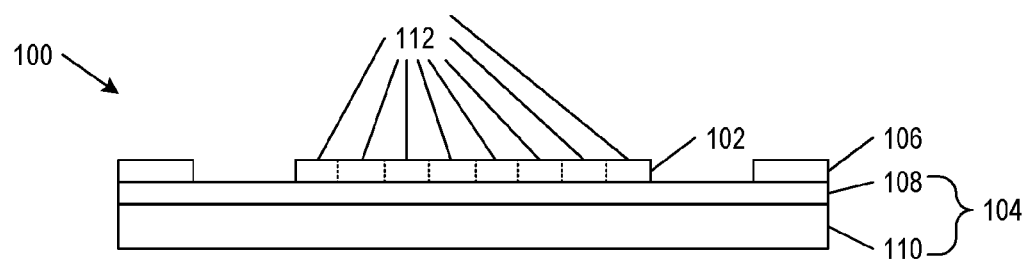
FIG. 1 illustrates a cross-sectional view of a ceramic phosphor held by a dicing tape mounted to a tape frame.

FIG. 1 illustrates a cross-sectional view 100 of a ceramic phosphor 102 held by a dicing tape 104 mounted to a tape frame 106. Dicing tape 104 may be a tacky tape having a tacky layer 108 on a support film 110. Ceramic phosphor 102 is diced from frame-mounted dicing tape 104 to form ceramic phosphor plates 112 (shown separated by phantom cut lines). Dicing tape 104 may be stretched to laterally separate ceramic phosphor plates 112. Dicing tape 104 may be a UV tape when the adhesive bond of tacky layer 108 can be modulated by UV-exposure, allowing the adhesive bond to be stronger during cutting and weaker during removal of ceramic phosphor plates 112.

Tacky layer 108 includes acrylic and leaves acrylic residues on ceramic phosphor plates 112 after they are removed from dicing tape 104. Ceramic phosphor plates 112 may undergo additional tape transfers subsequent to dicing, thereby exposing both sides of the plates to acrylic tapes. It has been determined that the acrylic residues from the acrylic tapes used in dicing and other tape transfers cause browning and light stressing (stress due to high dosage of photonic flux) in the ceramic phosphor plates, which leads to early failures of the LED dies. Even when ceramic phosphor plates 112 are cleaned with plasma to remove organic molecules and a "flip transfer" is used to minimize tape contact after cleaning, the resulting LED dies still experience a 5 to 6% flux drop.

It is believed that residual molecules trapped in the gap (glue) between a ceramic phosphor plate and a LED die undergo photo and thermo-chemical degradation (photo-pyrolisis) that lead to light-absorbing species. This is especially prevalent if there is a lack of oxygen to photobleach the light-absorbing species as the glued area is very large relative to the bondline (glue thickness) so there is a long path across the narrow gap filled with glue that limits gas exchange.

Examples of the present disclosure prevent acrylic contamination by using dicing tape with an acrylic-free tacky layer. The tacky layer may be formed over a support film of the dicing tape, or the tacky layer may be a tacky film or sheet laminated over the support film of the dicing tape.

Figure 2:
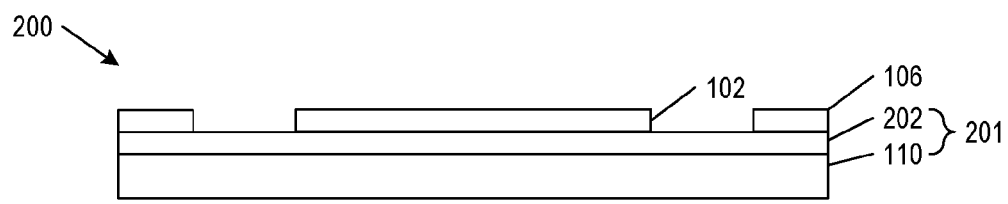
FIG. 2 illustrates a cross-sectional view of a dicing tape with a support film and an acrylic-free tacky layer over the support film in examples of the present disclosure.

FIG. 2 illustrates a cross-sectional view 200 of a dicing tape 201 with a support film 110 and an acrylic-free tacky layer 202 on the support film 110 in examples of the present disclosure. Dicing tape 201 is mounted on tape frame 106 via tacky layer 202.

Ceramic phosphor 102 may be diced from frame-mounted dicing tape 201. Ceramic phosphor may be Lumiramics from Lumileds of San Jose, Calif. Tacky layer 202 may be a silicone thermosetting resin that is free of acrylic. Tacky layer 202 may also be free of any metal-containing catalyst including platinum (Pt), tin (Sn), or zinc (Z). A metal-containing catalyst may be a compound that includes a metal coordinated or forming salts with several organic ligands. Examples of metal-containing catalysts are found in U.S. Pat. No. 5,561,231. For example, Pt-based catalysts are undesirable because it forms light-absorbing colloidal nanoparticles towards the end of the crosslinking process, for example, as discussed by H. Bai in Ind. Eng. Chem. Res. 2014, 53, 1588-1597. Pt is also a catalyst for certain organic reactions, including some that lead to browning in phenylene-containing silicones. Furthermore, silicones are typically spiked with inhibitors in Pt-catalyzed systems to lengthen pot lifetime (working time), and these additives may brown or inhibit the polymerization of the die-attaching glue if they inhibit the catalyst of the glue.

Tacky layer 202 may include a photo-latent or photo-initiated amine catalyst (also known as a "photo-base generator" or "photo-anionic initiator") so the adhesive bond of tacky layer 202 can be modulated by photo-developing tacky layer 202. This allows the adhesive bond of tacky layer 202 to be stronger during ceramic phoshpor cutting and weaker during ceramic phosphor plates removal. The amine catalyst forms a neutral salt between a base and an acide. The base may be DBU (1,5-diazabicyclo[5.4.0]undec-5-ene), DBN (1,5-diazabicyclo[4.3.0]non-5-ene), or etc., and the acid may be Ketoprofen ((RS)2-(3-benzoylphenyl)-propionic acid) or a phenylglycolic acid. Upon UV irradiation, the phenylglycolic or benzoylphenyl component of the acid absorbs light and undergoes a decarboxylation reaction (generating $CO_2$) and the base (DBN, DBU, etc.) becomes free. The base is then capable of catalyzing condensation and ring opening polymerization reactions.

Tacky layer 202 may be LF-1010, LF-1011, or LF-1012 (also known as "Hot Melt") adhesives available from Dow Corning of Midland, Mich., or HT-8200, HT-8800, or HT-8660 (also known as "XLED") encapsulants available from SiVance LLC of Gainesville, Fla., which is a subsidiary of Milliken Chemical of Spartanburg, S.C.

Figure 3:
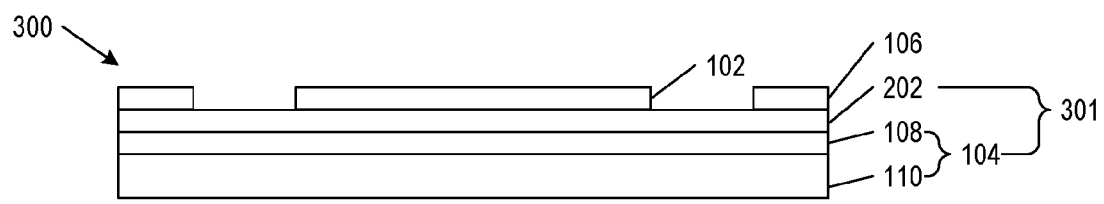
FIG. 3 illustrates a cross-sectional view of a dicing tape with another dicing tape and an acrylic-free tacky layer on the other dicing tape in examples of the present disclosure.

FIG. 3 illustrates a cross-sectional view 300 of a dicing tape 301 with dicing tape 104 and an acrylic-free tacky 202 on dicing tape 104 in examples of the present disclosure. Dicing tape 301 is mounted on tape frame 106 via tacky layer 202. Ceramic phosphor 102 may be diced from frame-mounted dicing tape 301.

In FIG. 3, tacky layer 202 is located on the tacky layer 108 side of dicing tape 104. Tacky layer 202 prevents ceramic phosphor 102 from interacting with tacky layer 108 of dicing tape 104. In some examples, tacky layer 202 is located on support film 110 side of dicing tape 104. In such examples, dicing tape 104 may be without tacky layer 108 so the thickness of the final frame-mounted tape 104 with ceramic phosphor 102 is reduced. Reducing the thickness of frame-mounted tape 104 may improve the pickup of ceramic phosphor plates 112 from the tape after dicing ceramic phosphor 102.

Figure 4:
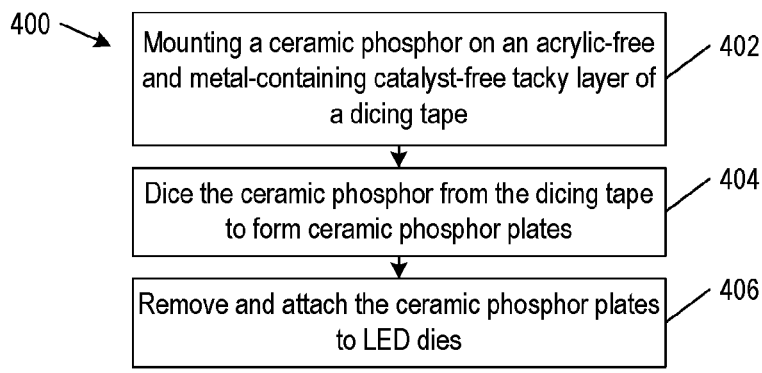
FIG. 4 is a flowchart of a method to provide ceramic phosphor plates to LED dies in examples of the present disclosure.

FIG. 4 is a flowchart of a method 400 to provide ceramic phosphor plates to LED dies in examples of the present disclosure. Method 400 may begin in block 402.

In block 402, ceramic phosphor 102 is mounted on tacky layer 202 (FIG. 2 or 3) of dicing tape 201 or 301 (FIG. 2 or 3). Dicing tape 201 or 301 may be mounted on tape frame 106. In the examples shown in FIG. 3, tacky layer 202 may be between ceramic phosphor 102 and either the tacky layer 108 or support film 110 side of dicing tape 104. Block 402 may be followed by block 404.

In block 404, ceramic phosphor 102 is diced from dicing tape 201 or 301 into ceramic phosphor plates 112 (FIG. 2 or 3). Block 404 maybe followed by block 406.

In block 406, ceramic phosphor plates 112 are removed from dicing tape 201 or 301 and attached on LED dies (not shown). Prior to removal, tacky layer 202 may be photo-developed to lower its adhesive bond. For each die, a high refractive index (HRI) silicone-based glue is dispensed onto its sapphire and a ceramic phosphor plate 112 is picked and placed on the sapphire. The silicon-base glue may be XLED encapsulants available from SiVance LLC of Gainesville, Fla., which is a subsidiary of Milliken Chemical of Spartanburg, S.C.

Figure 5:
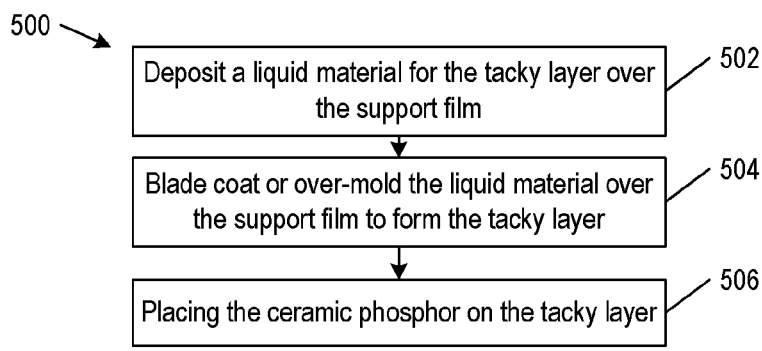
FIG. 5 is a flowchart of a method to provide the tacky layer by blade coating or over-mold casting in the method of FIG. 4 in examples of the present disclosure.

FIG. 5 is a flowchart of a method 500 to implement block 402 in examples of the present disclosure. Method 500 forms tacky layer 202 over support film 110 by blade coating or over-mold casting. Method 500 may begin in block 502.

In block 502, a liquid material for tacky layer 202 is deposited on support film 110 or tacky layer 108 on support film 110. Block 502 may be followed by block 504.

In block 504, the liquid material is blade coated or over-molded on support film 110 or tacky layer 108 to form tacky layer 202. For blade coating, a knife edge is dragged over the liquid material to form tacky layer 202 having a uniform thickness. For over-molding, a mold is applied to form tacky layer 202 having a uniform thickness. Block 504 may be followed by block 506.

In block 506, ceramic phosphor 102 is placed on and bonded to tacky layer 202. Ceramic phosphor 102 or tacky layer 202 may be preheated to aid the bonding process.

Figure 6:
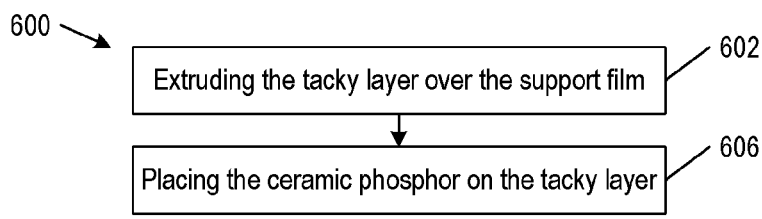
FIG. 6 is a flowchart of a method to provide the tacky layer by extruding in the method of FIG. 4 in examples of the present disclosure.

FIG. 6 is a flowchart of a method 600 to implement block 402 in examples of the present disclosure. Method 600 forms tacky layer 202 on over support film 110 by extrusion. Method 600 may begin in block 602.

In block 602, tacky layer 202 is extruded on support film 110 or tacky layer 108 on support film 110 using a roll-to-roll process. Block 602 may be followed by block 606.

In block 606, ceramic phosphor 102 is placed on and bonded to tacky layer 202.

Figure 7:
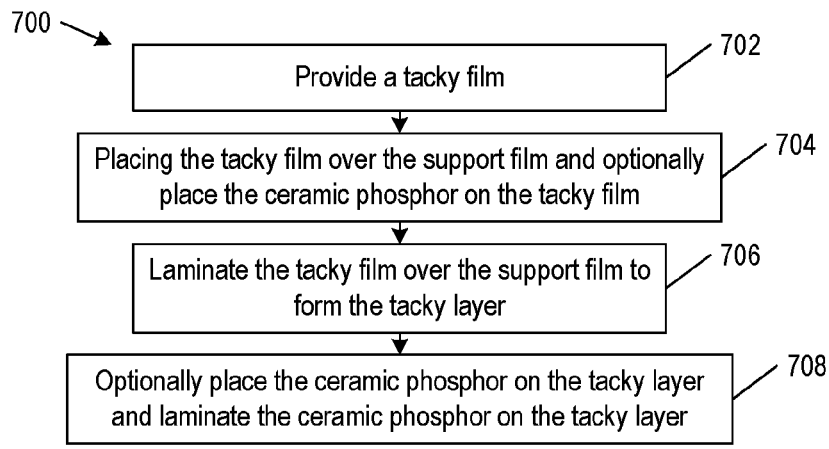
FIG. 7 is a flowchart of a method to provide the tacky layer by lamination in examples of the present disclosure.
Figure 8:
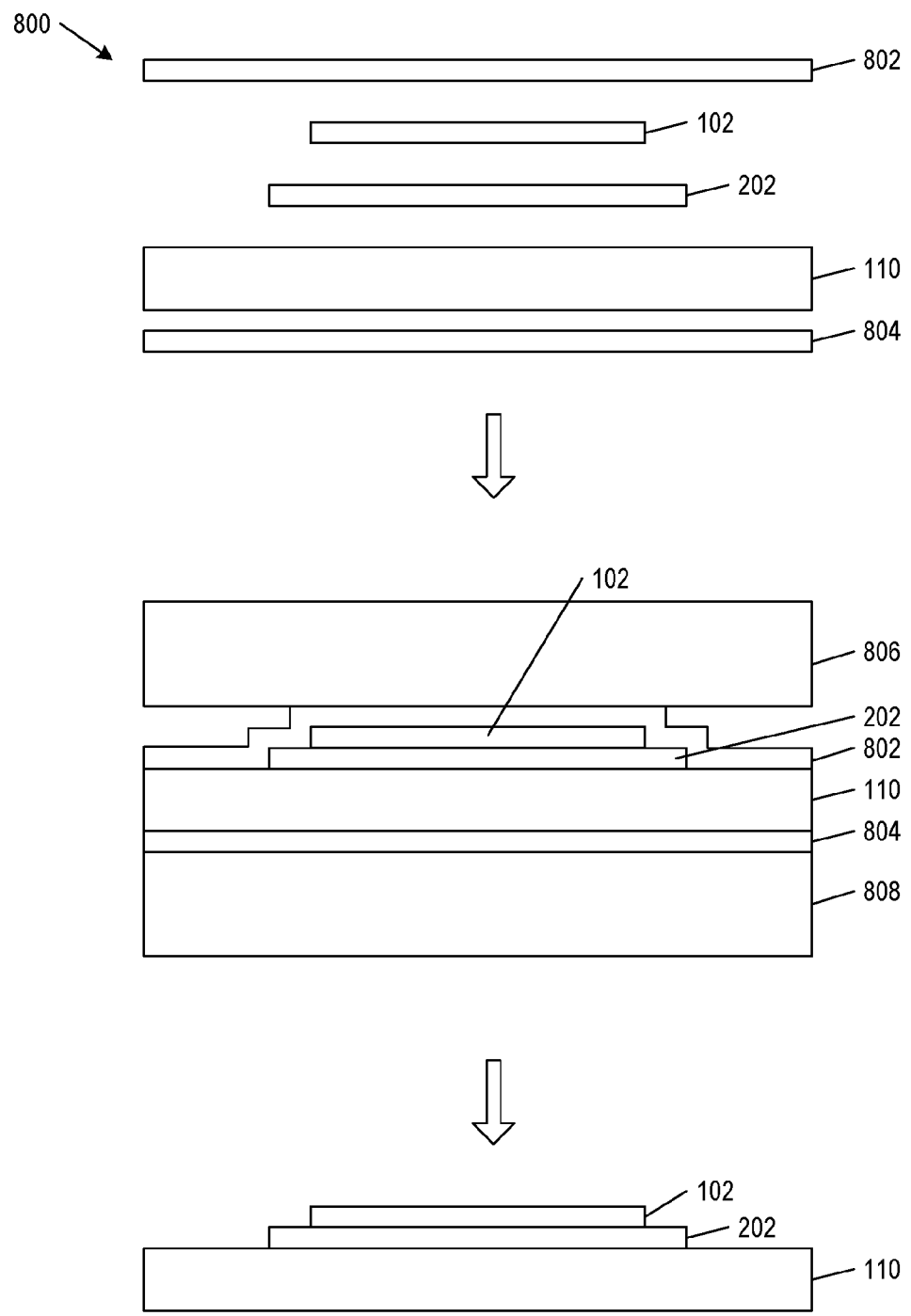
FIG. 8 shows cross-sectional views of a lamination process implemented by the method of FIG. 7 in examples of the present disclosure.

FIG. 7 is a flowchart of a method 700 to implement block 402 in examples of the present disclosure. Method 700 forms tacky layer 202 over support film 110 by lamination. Method 700 may occur after dicing tape 201 or 301 (FIG. 2 or 3) is mounted on tape frame 106. FIG. 8 shows cross-sectional views of this lamination process in examples of the present disclosure. Referring back to FIG. 7, method 700 may begin in block 702.

In block 702, a tacky sheet or film 801 (FIG. 8) is provided. Tacky film 801 may be formed by blade coating, over-mold casting, or extrusion using a roll-to-roll process. Block 702 may be followed by block 704.

In block 704, tacky film 801 is placed on support film 110 or tacky layer 108 on support film 110. Tacky film 801 may be preheated prior to laminating the film over support film 110. For example, tacky film 801 may be heated for 1 to 20 minutes at a temperature between 80 to 170 degrees Celsius. Ceramic phosphor 102 may be placed on tacky film 801 if it is to be laminated in the same process. A first release tape 802 (FIG. 8) may be placed on the top surface of ceramic phosphor 102 and a second release tape 804 (FIG. 8) may be placed on the bottom surface of support film 110. Block 704 may be followed by block 706.

In block 706, tacky film 801 is laminated over support film 110 to form tacky layer 202. Opposing presses or rollers 806, 808 (FIG. 8) apply the proper pressure and temperature to laminate the layers together. Although not shown, a vacuum pump may be used to squeeze out bubbles between the layers. The lamination of tacky film 801 over support film 110 may occur over multiple stages with different times, temperatures, or pressures. For example, lamination may occur for a time of 0.5 second to several minutes, at a temperature between 80 to 170 degrees Celsius, and between a pressure of 1 to 30 bar. The pressure may be reduced when ceramic phosphor 102 is laminated in the same process due to its brittle nature. If release tapes 802 and 804 (FIG. 8) are used, they are removed after lamination. Block 706 may be followed by block 708.

In block 708, ceramic phosphor 102 may be placed on tacky layer 202 if it had not already been placed in block 704 and laminated in block 706, and another lamination process is used to laminate ceramic phosphor 102 on tacky layer 202.

Various other adaptations and combinations of features of the embodiments disclosed are within the scope of the invention. Numerous embodiments are encompassed by the following claims.

The invention claimed is:

1. A method, comprising:
dispensing a liquid material for an acrylic-free and metal-containing catalyst-free tacky layer onto a support film or another tacky layer of a dicing tape;
blade coating the liquid material on the support film or the other tacky layer to form the acrylic-free and metal-containing catalyst-free tacky layer;
placing a ceramic phosphor on the acrylic-free and metal-containing catalyst-free tacky layer of a dicing tape;
dicing the ceramic phosphor on the dicing tape into ceramic phosphor plates;
removing the ceramic phosphor plates from the dicing tape; and
attaching the ceramic phosphor plates onto light-emitting device (LED) dies.

2. The method of claim 1, wherein the acrylic-free and metal-containing catalyst-free tacky layer comprises a silicone thermoforming resin free of acrylic and platinum and is free of a metal-containing catalyst comprising platinum, tin, or zinc.

3. The method of claim 1, wherein the dicing tape is mounted on a tape frame.

4. The method of claim 1, wherein:
the acrylic-free and metal-containing catalyst-free tacky layer comprises a photo-latent or photo-initiated amine catalyst; and
removing the ceramic phosphor plates comprises photo-developing the acrylic-free and metal-containing catalyst-free tacky layer to lower its adhesive bond to the ceramic phosphor plates.

5. The method of claim 1, wherein attaching the ceramic phosphor plates on LED dies includes applying a high refractive index (HRI) silicone-based glue on the LED dies.

6. The method of claim 1, wherein the other tacky layer comprises acrylic.

7. A method, comprising:
dispensing a liquid material for an acrylic-free and metal-containing catalyst-free tacky layer onto a support film or another tacky layer of a dicing tape;
over-molding the liquid material on the support film or the other tacky layer to form the acrylic-free and metal-containing catalyst-free tacky layer;
placing a ceramic phosphor on the acrylic-free and metal-containing catalyst-free tacky layer of a dicing tape;
dicing the ceramic phosphor on the dicing tape into ceramic phosphor plates;
removing the ceramic phosphor plates from the dicing tape; and
attaching the ceramic phosphor plates onto light-emitting device (LED) dies.

8. The method of claim 7, wherein:
the acrylic-free and metal-containing catalyst-free tacky layer comprises a photo-latent or photo-initiated amine catalyst; and
removing the ceramic phosphor plates comprises photo-developing the acrylic-free and metal-containing catalyst-free tacky layer to lower its adhesive bond to the ceramic phosphor plates.

9. The method of claim 7, wherein the acrylic-free and metal-containing catalyst-free tacky layer comprises a silicone thermoforming resin free of acrylic and platinum and is free of a metal-containing catalyst comprising platinum, tin, or zinc.

10. The method of claim 7, wherein the dicing tape is mounted on a tape frame.

11. The method of claim 7, wherein attaching the ceramic phosphor plates on LED dies includes applying a high refractive index (HRI) silicone-based glue on the LED dies.

12. The method of claim 7, wherein the other tacky layer comprises acrylic.

13. A method, comprising:
extruding an acrylic-free and metal-containing catalyst-free tacky layer onto a support film or another tacky layer of a dicing tape through a roll-to-roll process;
placing a ceramic phosphor on the acrylic-free and metal-containing catalyst-free tacky layer;
dicing the ceramic phosphor on the dicing tape into ceramic phosphor plates;
removing the ceramic phosphor plates from the dicing tape; and
attaching the ceramic phosphor plates onto light-emitting device (LED) dies.

14. The method of claim 13, wherein the acrylic-free and metal-containing catalyst-free tacky layer comprises a silicone thermoforming resin free of acrylic and platinum and is free of a metal-containing catalyst comprising platinum, tin, or zinc.

15. The method of claim 13, wherein the dicing tape is mounted on a tape frame.

16. The method of claim 13, wherein:
the acrylic-free and metal-containing catalyst-free tacky layer comprises a photo-latent or photo-initiated amine catalyst; and
removing the ceramic phosphor plates comprises photo-developing the acrylic-free and metal-containing catalyst-free tacky layer to lower its adhesive bond to the ceramic phosphor plates.

17. The method of claim 13, wherein attaching the ceramic phosphor plates on LED dies includes applying a high refractive index (HRI) silicone-based glue on the LED dies.

18. The method of claim 13, wherein the other tacky layer comprises acrylic.

* * * * *